United States Patent
Berland et al.

(10) Patent No.: US 9,217,198 B2
(45) Date of Patent: Dec. 22, 2015

(54) INSERTION OF LITHIUM INTO ELECTROCHROMIC DEVICES AFTER COMPLETION

(75) Inventors: Brian Spencer Berland, Morrison, CO (US); Bruce Roy Lanning, Littleton, CO (US); Jonathan Mack Frey, Denver, CO (US); Kathryn Suzanne Barrett, Boise, ID (US); Paul Damon DuPont, Morrison, CO (US); Ronald William Schaller, Centennial, CO (US)

(73) Assignee: ITN Energy Systems, Inc., Littleton, CO (US)

( * ) Notice: Subject to any disclaimer, the term of this patent is extended or adjusted under 35 U.S.C. 154(b) by 657 days.

(21) Appl. No.: 13/544,391

(22) Filed: Jul. 9, 2012

(65) Prior Publication Data

US 2013/0101751 A1   Apr. 25, 2013

Related U.S. Application Data

(60) Provisional application No. 61/505,317, filed on Jul. 7, 2011.

(51) Int. Cl.
   *C23C 14/48*   (2006.01)
   *C23C 14/54*   (2006.01)

(52) U.S. Cl.
   CPC .............. *C23C 14/48* (2013.01); *C23C 14/548* (2013.01)

(58) Field of Classification Search
   CPC ............................ C23C 14/48; C23C 14/548
   See application file for complete search history.

(56) References Cited

U.S. PATENT DOCUMENTS

| | | |
|---|---|---|
| 6,139,987 A | 10/2000 | Koo et al. |
| 6,392,387 B1 | 5/2002 | Sage et al. |
| 6,515,787 B1 | 2/2003 | Westfall et al. |
| 6,753,108 B1 | 6/2004 | Hampden-Smith et al. |
| 6,822,778 B2 | 11/2004 | Westfall et al. |
| 6,856,444 B2 | 2/2005 | Ingalls et al. |
| 6,967,183 B2 | 11/2005 | Hampden-Smith et al. |
| 7,009,750 B1 | 3/2006 | Westfall et al. |
| 7,087,341 B2 | 8/2006 | Hampden-Smith et al. |
| 7,126,091 B1 | 10/2006 | Westfall et al. |
| 7,133,181 B2 | 11/2006 | Greer |
| 7,145,709 B1 | 12/2006 | Westfall et al. |
| 7,215,457 B1 | 5/2007 | Westfall et al. |
| 7,265,890 B1 | 9/2007 | Demiryont |
| 7,265,891 B1 | 9/2007 | Demiryont |

(Continued)

OTHER PUBLICATIONS

U.S. Appl. No. 13/717,215, Office Action mailed Jan. 8, 2015, 17 pgs.

(Continued)

*Primary Examiner* — Dah-Wei D Yuan
*Assistant Examiner* — Kristen A Dagenais
(74) *Attorney, Agent, or Firm* — George C. Lewis; Merchant & Gould P.C.

(57) ABSTRACT

The present disclosure describes methods of inserting lithium into an electrochromic device after completion. In the disclosed methods, an ideal amount of lithium can be added post-fabrication to maximize or tailor the free lithium ion density of a layer or the coloration range of a device. Embodiments are directed towards a method to insert lithium into the main device layers of an electrochromic device as a post-processing step after the device has been manufactured. In an embodiment, the methods described are designed to maximize the coloration range while compensating for blind charge loss.

16 Claims, 4 Drawing Sheets

(56) References Cited

U.S. PATENT DOCUMENTS

| | | |
|---|---|---|
| 7,277,215 B2 | 10/2007 | Greer |
| 7,362,490 B2 | 4/2008 | Park |
| 7,372,610 B2 | 5/2008 | Burdis et al. |
| 7,531,239 B2 | 5/2009 | Demiryont |
| 7,586,667 B2 | 9/2009 | Demiryont |
| 7,593,154 B2 | 9/2009 | Burdis et al. |
| 7,619,804 B1 | 11/2009 | Demiryont |
| 7,666,233 B2 | 2/2010 | Visco et al. |
| 7,704,555 B2 | 4/2010 | Demiryont |
| 7,830,585 B2 | 11/2010 | Widjaja et al. |
| 8,048,571 B2 | 11/2011 | Visco et al. |
| 8,202,649 B2 | 6/2012 | Visco et al. |
| 2003/0049517 A1 | 3/2003 | Hampden-Smith et al. |
| 2004/0067417 A1 | 4/2004 | Oosawa et al. |
| 2004/0185336 A1 | 9/2004 | Ito et al. |
| 2006/0209383 A1* | 9/2006 | Burdis et al. .................. 359/265 |
| 2007/0012244 A1 | 1/2007 | Klaassen |
| 2007/0051620 A1 | 3/2007 | Visco et al. |
| 2007/0103612 A1* | 5/2007 | Lumpkin ........................ 349/42 |
| 2009/0159582 A1 | 6/2009 | Chami et al. |
| 2010/0086851 A1 | 4/2010 | Wang et al. |
| 2010/0227214 A1 | 9/2010 | Krasnov et al. |
| 2011/0117417 A1 | 5/2011 | Pitts |
| 2011/0267674 A1* | 11/2011 | Wang et al. .................. 359/273 |
| 2013/0078535 A1 | 3/2013 | Aizawa |
| 2013/0154113 A1 | 6/2013 | Frey |
| 2013/0157152 A1 | 6/2013 | Lanning et al. |
| 2013/0171527 A1 | 7/2013 | Lanning et al. |
| 2013/0201545 A1 | 8/2013 | Frey et al. |
| 2013/0224590 A1 | 8/2013 | Divigalpitiya |
| 2014/0227609 A1 | 8/2014 | Frey et al. |

OTHER PUBLICATIONS

U.S. Appl. No. 13/758,468, Notice of Allowance mailed Dec. 22, 2014, 9 pgs.

U.S. Appl. No. 13/731,554, Amendment and Response filed Oct. 24, 2014, 5 pgs.

U.S. Appl. No. 13/731,554, Notice of Allowance mailed Nov. 7, 2014, 7 pgs.

PCT International Search Report and Written Opinion in International Application PCT/US2012/056685, mailed Nov. 30, 2012, 8 pgs. Dagenais/ (Mar. 19, 2015) /Kristen 23552 Patent Trademark Office.

U.S. Appl. No. 13/758,468, Notice of Allowance mailed Jun. 9, 2014, 9 pgs.

Electric Power Research Institute, Development of Flexible Electrochromic Films, 1018525, Technical Update, Dec. 2009, EPRI Project Manager: K.R. Amarnath, 2009, 42 pgs.

U.S. Appl. No. 13/731,554, Office Action mailed Aug. 1, 2014, 7 pgs.

U.S. Appl. No. 13/717,364, Notice of Allowance mailed Sep. 18, 2013, 9 pgs.

* cited by examiner

INSERTION OF LITHIUM INTO ELECTROCHROMIC DEVICES AFTER COMPLETION

RELATED APPLICATIONS

This application is related to co-owned U.S. Patent Application Ser. No. 61/505,317, entitled "Insertion of Lithium Into Electrochromic Devices After Completion" filed on Jul. 7, 2011, the entire disclosure of which is hereby incorporated herein by reference.

STATEMENT OF RIGHTS TO INVENTIONS MADE UNDER FEDERALLY SPONSORED RESEARCH AND DEVELOPMENT

This invention was made with government support under contract number DE-AR0000019 awarded by the United States Department of Energy. The United States government has certain rights in the invention.

INTRODUCTION

Electrochromic devices are used in a variety of applications. For example, in one application a thin electrochromic device is deposited on a flexible plastic substrate to create an electrochromic film. The electrochromic film is used in conjunction with an architectural window to create a "smart window." The electrochromic film changes transmission based on the voltage applied across its electrodes. This allows a window to transition from a more transparent, or "bleach", state to a less transparent, dark or "color", state depending on an applied electrical potential. The bleach state will allow more transmission of light than the color state. Smart windows can be used for privacy purposes, such as controlling when something behind a barrier is visible, or for environmental reasons. These environmental reasons include tinting, or reducing the amount of light through a window. Light reduction can be beneficial not only aesthetically, but also in terms of energy consumption. With the use of smart windows less energy is needed to cool an enclosed space such as an office building because less heat is being transmitted through windows.

When using electrochromic devices, such as but not limited to smart windows, the coloration range is a critical performance metric of the device. For a smart window, the transmission is often defined as the average transmission across visible wavelengths (400-730 nm). Transmission is measured for both the bleached and colored states. The coloration range is defined as the difference in transmission between the two states. Generally this range is desired to be as large as possible, and to remain stable over long term operation. Coloration range can be affected by the number of ions, often lithium, that actively flow between the ion storage layer and the electrochromic layer of the device. Generally if more of the active ion is present, a larger coloration range is possible. It is also important to note that transmission modulation through a lithium EC device also takes place at wavelengths outside of the visible spectrum, e.g. within the near infrared to infrared wavelengths.

BRIEF DESCRIPTION OF THE DRAWINGS

Non-limiting and non-exhaustive embodiments are described with reference to the following figures.

INSERTION OF LITHIUM INTO ELECTROCHROMIC DEVICES

Figure 1:
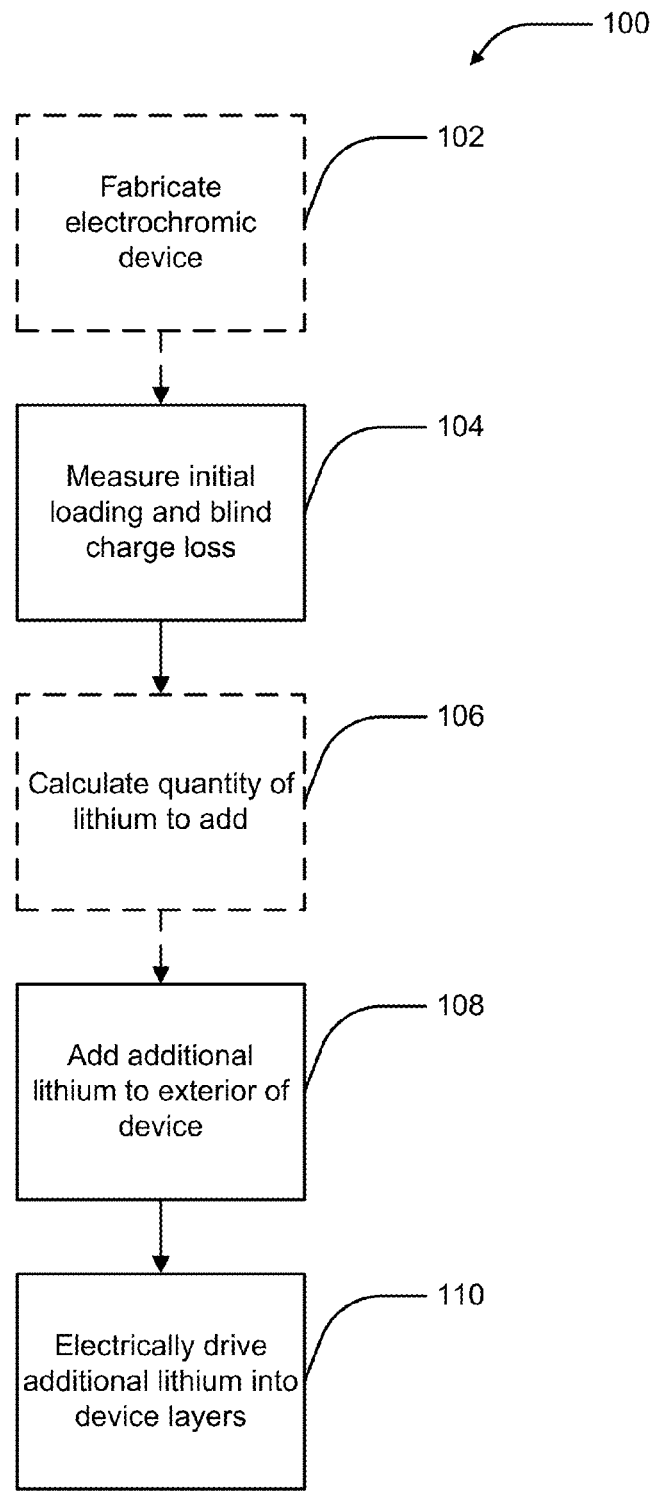
FIG. 1 illustrates a flow chart for an embodiment of a method for adding lithium to an electrochromic device post-fabrication.

The present disclosure describes methods of inserting lithium into an electrochromic device after completion. In the disclosed methods, an ideal amount of lithium can be added post-fabrication to maximize or tailor the free lithium ion density of a layer or the coloration range of a device. Embodiments are directed towards a method to insert lithium into the main device layers of an electrochromic device as a post-processing step after the device has been manufactured. In an embodiment, the methods described are designed to maximize the coloration range while compensating for blind charge loss.

In part, this disclosure describes a method for inserting ions into device layers of a solid state electrochromic device. The method includes:
a) fabricating an electrochromic device with an initial concentration of ions, wherein the electrochromic device has an operable coloration range of at least 5%;
b) conducting at least one test on the electrochromic device;
c) measuring at least one material property during the test;
d) depositing a quantity of the ions onto a surface of the electrochromic device based on the measured material property; and
e) electrically driving the quantity of the ions into device layers of the electrochromic device.

Yet another aspect of this disclosure describes a method of manufacturing a solid state electrochromic device having a target amount of ions including:
a) fabricating an electrochromic device with an initial concentration of ions less than a target amount;
b) conducting at least one test on the electrochromic device;
c) measuring at least one material property during the test;
d) depositing a quantity of the ions onto a surface of the electrochromic device based on the measured material property;
e) electrically driving the quantity of the ions into device layers of the electrochromic device; and
f) repeatedly performing the testing, measuring, depositing, and driving operations until a material property measurement indicative of the target amount of the ions is achieved.

The disclosure further describes a method to insert ions into device layers of a solid state electrochromic device, the method includes:
a) conducting at least one test on an electrochromic device;
b) measuring at least one material property during the test;
c) depositing a quantity of the ions onto a surface of the electrochromic device based on the measured material property; and
d) electrically driving the quantity of the ions into device layers of the electrochromic device.

These and various other features as well as advantages which characterize the systems and methods described herein will be apparent from a reading of the following detailed description and a review of the associated drawings. Additional features are set forth in the description which follows, and in part will be apparent from the description, or may be learned by practice of the technology. The benefits and features of the technology will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

DETAILED DESCRIPTION

With the herein described methods of inserting lithium into an electrochromic device after completion an ideal amount of lithium can be added post-fabrication to maximize coloration range. Embodiments are directed towards a method to insert lithium into the main device layers of an electrochromic device as a post-processing step after the device has been manufactured. The methods described are designed to maximize the coloration range while compensating for blind charge loss.

Various embodiments are described more fully below with reference to the accompanying drawings, which form a part hereof, and which show specific exemplary embodiments. However, embodiments may be implemented in many different forms and should not be construed as limited to the embodiments set forth herein; rather, these embodiments are provided so that this disclosure will be thorough and complete, and will fully convey the scope of the embodiments to those skilled in the art. The following detailed description is, therefore, not to be taken in a limiting sense.

When manufacturing an electrochromic device the amount of lithium used is critical to the properties, such as but not limited to the coloration range, of the device. Lithium, or a similarly used ion, can be trapped within or permanently react with the electrode layers during fabrication and/or subsequent cycling. In these cases, while the lithium remains in the film stack, it does not effectively participate in the device coloration. The amount of lithium that ceases to participate in coloration is often referred to as blind charge loss. The permanent association of lithium with an undesirable reaction site results in a decrease in the available lithium ions to actively flow in the device, and therefore a permanent decrease in coloration range.

A challenge for electrochromic device manufacturers is to introduce sufficient lithium ions into the electrochromic device to achieve the desired coloration range. While a strategy of adding a large excess of lithium into the system during the initial fabrication could be used to account for undesirable losses, i.e. blind charge loss, this strategy can also introduce irreversible coloration and/or device durability issues that preclude it as a viable strategy. Also, if there are not enough lithium ions, the coloration range will be less than optimal. Further, the concentration of active lithium ions is desired to remain constant, electrochemically and colorimetrically, over tens of thousands of cycles in an architectural window product, so anything that increases losses over time is undesirable.

Once a working electrochromic device is manufactured tests can be performed during the first few switching cycles to determine the amount of active ions in the device, hereinafter referred to as the initial loading, and also determine the blind charge loss.

According to the methods of this disclosure, a flow chart for one embodiment of a method can be seen in FIG. 1. In an embodiment, the method 100 starts with a fabrication operation 102, in which the fabrication of an electrochromic device with an initial concentration of lithium ions is performed using methods currently known in the industry or future solid state fabrication techniques. There exist a variety of means, both vacuum and nonvacuum, to fabricate an electrochromic device and deposit each of the materials, such as but not limited to physical vapor deposition, chemical vapor deposition, thermal evaporation, pulsed laser deposition, sputter deposition, and sol-gel processes. In the method described herein, the fabricated device is a completed and functional electrochromic device, but may not have the functional coloration range desired. For example, a functional eletrochromic device may have an active ion concentration sufficient to produce a 5% coloration range or greater, but still not have the desired properties for the device. In an embodiment, the fabrication operation 102 is optional. An electrochromic device that was previously fabricated may be used. In this embodiment, the device never did, or no longer does, possess the desired device properties.

The method 100 further includes a measure material properties operation 104. Material properties such as, but not limited to, initial loading, blind charge loss, charge capacity, discharge capacity, potential as a function of color state, and transmission range are measured in the measure material properties operation 104. In an embodiment, the measure material properties operation 104 involves electrochemical switching of the device and measuring charge capacity and/or transmission response. In an embodiment, at least one of a variety of measurements currently known or future measurements suitable to measure properties of an electrochromic device is performed. These material properties may then be used in calculating the amount of additional lithium to deposit that will best prevent blind charge loss, while simultaneously maximizing the coloration range. The measure material properties operation 104 may be performed in any suitable method as is known in the art. In an embodiment of the measure material properties operation 104 the device is cycled between its bleached and colored states using a trapezoidal voltage profile. For example, the voltage can be ramped to 1-5V at a rate of 50 mV/sec, and then held constant for 1-30 minutes. Subsequently the voltage can be ramped to −1V to −5V at a rate of −50 mV/sec and held at a fixed negative voltage for 1-30 minutes. The process may be repeated for a number of cycles and the transmission characteristics are periodically measured with a spectrophotometer from 400-730 nm.

Various uses for the device have different ideal quantities, $x_{target}$, of lithium to be active. With a smaller amount of active lithium the switching of the device between states is faster, whereas with a larger amount of lithium it is possible to achieve a larger coloration range. Normal variations in the manufacturing process will lead to variable lithium loading as well as blind charge loss. The parameters measured include only active lithium and therefore account for these variations.

In an embodiment, the measurements obtained during the measure material properties operation 104 are used to calculate the quantity of additional lithium ions to add to the device to achieve the optimal loading in a calculation operation 106. In an embodiment, the calculation operation 106 is optionally performed. In an embodiment, the resulting measured material property from the measure material properties operation 104 is compared to a threshold level to determine whether additional ions are needed. If additional ions are needed the method 100 will proceed to an addition operation 108, and if additional ions are not needed the method 100 will conclude.

In an embodiment, a mathematical equation or algorithm is used during the calculation operation 106 to determine the quantity of additional ions needed to achieve the desired properties, such as but not limited to coloration range. In an embodiment a comparison between the measured active lithium and the desired target level is used. In an embodiment, a simple ratio or percentage may be used based on the measured material properties. For example, if the material property is a minimum colored transmission rate and the measured property is 150% of the target property, a quantity of ions needed may be determined based on this percentage. So if the initial ion loading is known, an amount equal to 50% of the initial ion loading may be added. One skilled in the art will realize that specific equations or models for calculation of an amount of ions to add will vary depending on the relationship between the measured material property and ion loading.

The method 100 further includes the addition operation 108. During the addition operation 108, additional ions are deposited on the outside surface of the electrochromic device. In an embodiment the determined quantity of additional ions from the calculation operation 106 are deposited on the device using any suitable deposition means, both vacuum and nonvacuum, such as but not limited to physical vapor deposition, chemical vapor deposition, thermal evaporation, pulsed laser deposition, sputter deposition, and sol-gel processes. The additional ions may be deposited in a variety of locations on a variety of layers. In an embodiment the additional ions are deposited on the exterior surface of the electrochromic device at a location where an electrical signal may integrate the additional ions with the active ions used in the device. In an embodiment a sealant or other layers need to be removed before the additional ions may be deposited. In an embodiment, if the measured material property is less than a threshold level, an amount of ions are deposited where the amount is predetermined or chosen by an operator.

In an embodiment of the addition operation 108, the difference between the amount of active lithium in the device and the desired amount of lithium is added to the exterior of the device. This value can accurately be determined by monitoring the mass of lithium deposited using a quartz crystal microbalance or by calculation based on the deposition rate or thickness of the coating. Various processes can be used to add the lithium, such as but not limited to physical vapor deposition. A benefit of the herein described methods is that lithium can be added at any time after step 102, including after the electrochromic device has been operating in the field for many years.

Figure 3:
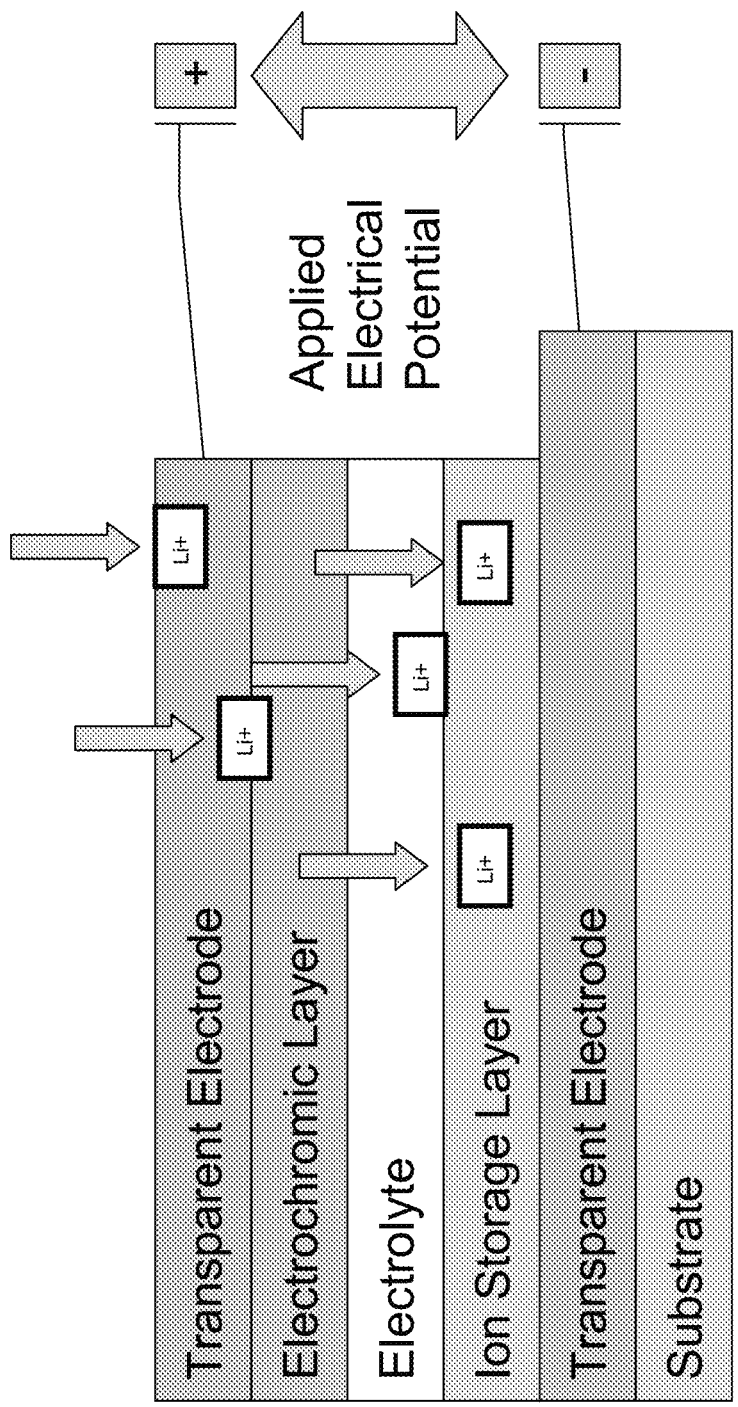
FIG. 3 illustrates the driving of lithium into the main device layers.

The method 100 further includes an electrical driving operation 110. During the electrical driving operation 110 ions, such as lithium, are electrically driven into the device layers. After the lithium has been deposited on the outside of the fabricated structure, as in the addition operation 108, an electrical potential is applied across the electrode layers and can be used to incorporate the lithium into the device layers in the electrical driving operation 110. The driving of lithium in the electrical driving operation 110 is graphically illustrated in FIG. 3. In an embodiment, a 3V DC bias can be applied across the electrodes of the device for 1-1,000 minutes. Various methods to electrically drive the lithium into the structure such as but not limited to current sourcing, pulsed current or voltage, or frequency modulated current or voltage can be used. Optionally the device with the lithium added may then undergo measurements similar to those in the measure material properties operation 104 to ensure the proper level of active lithium ions are present. If the level of lithium ions is not satisfactory the measure material properties operation 104 through the electrical driving operation 110 can be repeated as necessary.

Figure 2:
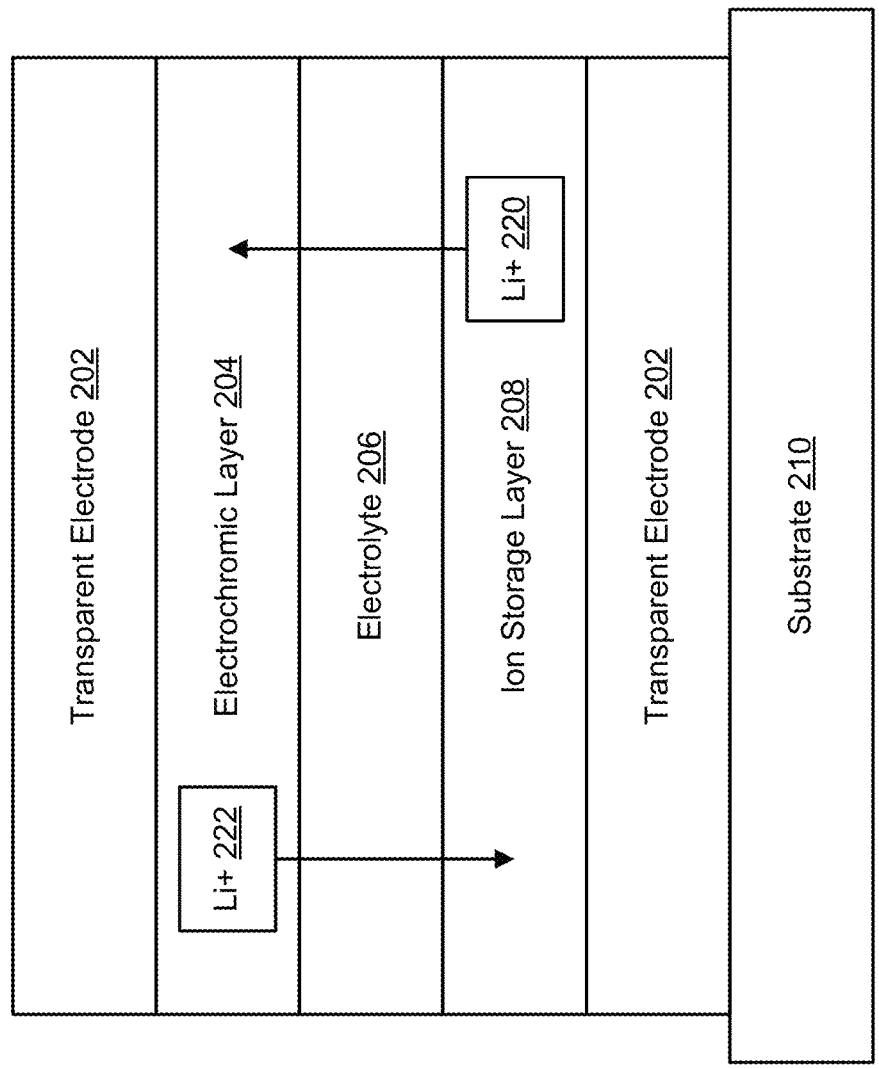
FIG. 2 illustrates an embodiment of the layers of a representative electrochromic device.

FIG. 2 illustrates the layers of a representative electrochromic device. An electrochromic device is fabricated, such as during the fabrication operation 102 of the above method 100, in a layered structure. A positive or negative bias can be used with this device depending on the materials used and fabrication process. It is desirable to manufacture either the electrochromic layer or ion storage layer with an optimal amount of ions sufficient for the device to achieve full coloration range, while minimizing the chance of blind charge loss.

In an embodiment, the electrochromic device includes transparent electrodes 202, an electrochromic layer 204, an electrolyte 206, an ion storage layer 208, and a substrate 210. In an embodiment the transparent electrodes 202 are a material that is electrically conductive and relatively transparent, such as indium tin oxide (ITO). In an embodiment, the electrochromic layer 204 is tungsten oxide. In an embodiment, the electrolyte 206 is lithium phosphorous oxynitride. In an embodiment, the ion storage layer 208 is lithium vanadium oxide. In an embodiment, the substrate 210 is polyethylene terephthalate. In another embodiment, the transparent electrode 202 is coated on the substrate 210 such as ITO coated PET.

It should be noted that this is a representative device and is a non-limiting and non-exhaustive embodiment of a layering structure in an electrochromic device. There are several possible variations to the representative device shown including, but not limited to, using glass as the substrate; using any number of lithiated metal oxides for the ion storage layer, or counter electrode, including lithium nickel oxide, lithiated mixed metal oxides (such as lithium nickel tungsten oxide where the W:Ni ratio is less than 1:1). The electrochromic (EC) layer could similarly be a mixed metal oxide (such as molybdenum tungsten oxide where the Mo:W ratio is less than 1:1). Also, there exist a variety of means, both vacuum and nonvacuum, to deposit each of the materials, such as but not limited to physical vapor deposition, chemical vapor deposition, thermal evaporation, pulsed laser deposition, sputter deposition, and sol-gel processes. In an embodiment, the counter electrode and/or electrochromic layer can be deposited as a metal oxide using a method such as reactive sputtering, and lithiated in a separate step, such as a physical vapor deposition of lithium.

It should be noted that the electrochromic layer 204 and the ion storage layer 208 may be interchanged. The only effect this will have on operation of the EC device is that the polarity of the signal used will need to be reversed. For example, in FIG. 2 the positive signal is be applied to the exterior transparent electrode, or the transparent electrode 202 furthest from the substrate, while the negative signal is applied to the interior transparent electrode, or the transparent electrode 202 closest to the substrate. If the electrochromic layer 204 and the ion storage layer 208 are interchanged, the positive signal would be applied to the interior transparent electrode and the negative signal would be applied to the exterior transparent electrode.

FIG. 2 further illustrates the movement of lithium during normal operation. As shown, the application of a potential across the electrodes causes the movement of lithium ions 220 into the electrochromic layer 204. This changes the coloration of the layer and decreases the transmission through the device. As shown the process can be reversed and the lithium ions 222 can flow back to the ion storage layer 208 thereby decreasing the coloration and increasing the transmission of light. Normally, a manufacturer will have a target active lithium amount, $x_{target}$, in mind for a particular device. While it is preferable to achieve the target properties in the initial fabrication, such as the fabrication operation 102 described in FIG. 1, depending on the process it is normal for some if not many of the devices in a process to exit the fabrication operation with an actual active lithium amount, $x_{initial}$, less than the target amount. Other devices may have $x_{target}=x_{initial}$, but will lose lithium ions to irreversible reaction sites during initial cycling. In both cases, the device will end up with fewer active lithium ions than desired to achieve the desired coloration range.

Example

Figure 4:
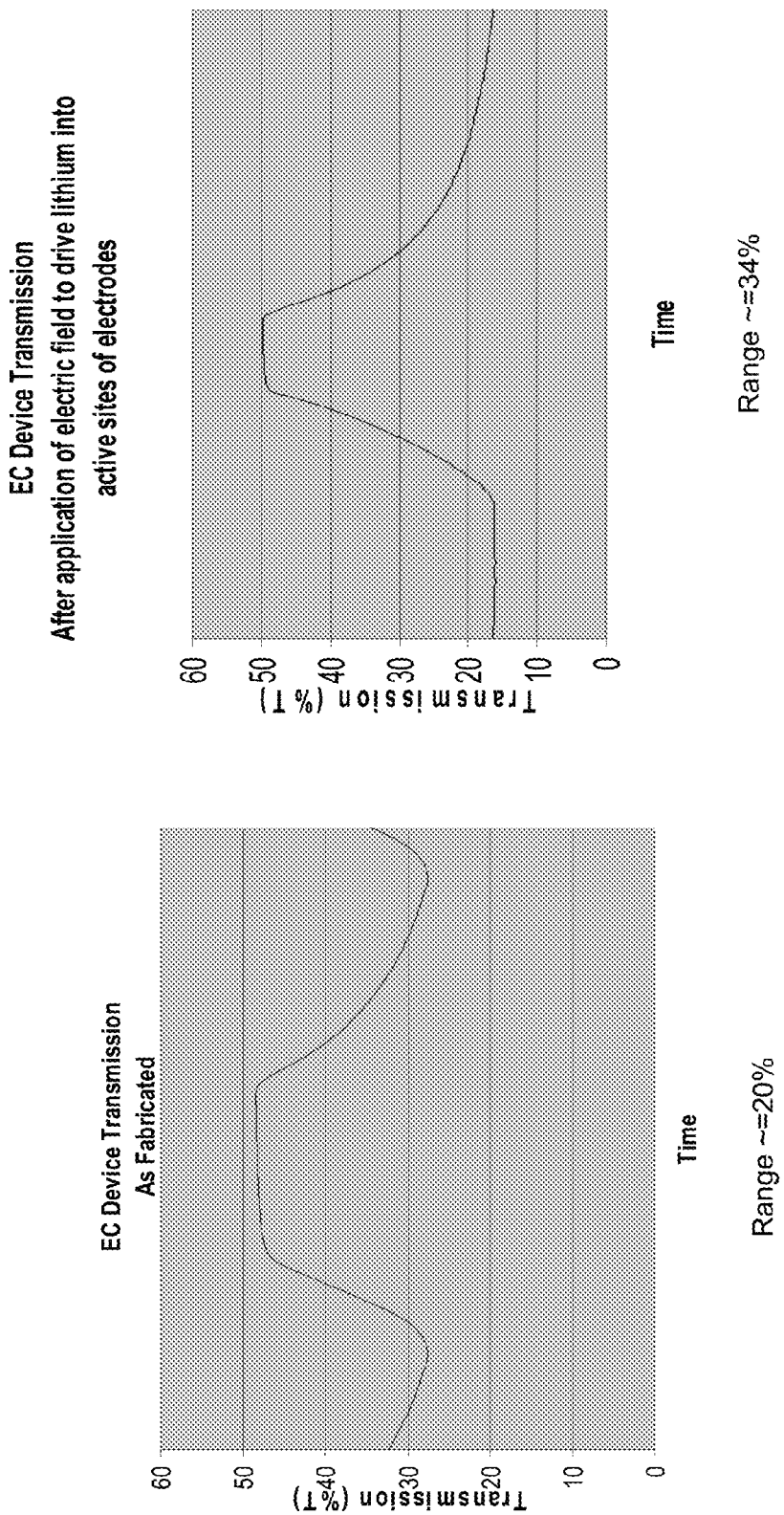
FIG. 4 presents results of testing an electrochromic device to show the transmission percentage in each state for an electrochromic device after fabrication and after the application of an electric field to drive lithium into the active sites in the electrodes.

Results of the exemplary method can be seen in FIG. 4. An electrochromic device fabricated in accordance with the fabrication operation 102 of the method 100 was tested. The device was shown to have an initial operable coloration range of approximately 20%. This range increased to 34% upon the addition of lithium to the device by the addition operation 108 followed by a cyclic application of electric field to drive the lithium into the active layers of the device by the electrical driving operation 110. Not only has the coloration range increased with the addition of lithium to the device after completion, but the bleach state has increased transmission and the color state has decreased transmission relative to the initial device.

It will be clear that the systems and methods described herein are well adapted to attain the ends and advantages mentioned as well as those inherent therein. Those skilled in the art will recognize that the methods and systems within this specification may be implemented in many manners and as such is not to be limited by the foregoing exemplified embodiments and examples. In other words, functional elements being performed by a single or multiple components and individual functions can be distributed among different components. In this regard, any number of the features of the different embodiments described herein may be combined into one single embodiment and alternate embodiments having fewer than or more than all of the features herein described are possible.

While various embodiments have been described for purposes of this disclosure, various changes and modifications may be made which are well within the scope of the disclosed methods. Numerous other changes may be made which will readily suggest themselves to those skilled in the art and which are encompassed in the spirit of the disclosure.

We claim:

1. A method to insert ions into device layers of a solid state electrochromic device, comprising:
   fabricating an electrochromic device with an initial concentration of ions: the electrochromic device including:
   an electrochromic layer;
   one or more top layers disposed on a top side of the electrochromic layer;
   and one or more bottom layers disposed on a bottom side of the electrochromic layer; wherein the electrochromic device has an operable coloration range of at least 5%, and further wherein the electrochromic device has at least a bleach state and a color state, the bleach state being more transparent than the color state;
   after fabricating the electrochromic device, conducting at least one test on the electrochromic device, wherein the test includes measuring at least one material property of the electrochromic device during the test;
   after conducting the at least one test, depositing a quantity of the ions onto a surface of the electrochromic device based on the measured material property; and
   after depositing the quantity of ions, electrically driving the quantity of the ions into at least one of the one or top layers or the one or more bottom layers of the electrochromic device.

2. The method of claim 1, wherein the at least one material property includes at least one of initial ion loading and blind charge loss.

3. The method of claim 1, wherein the ions comprise lithium.

4. The method of claim 1, wherein the ions comprise hydrogen.

5. The method of claim 1, wherein the step of depositing a quantity of the ions comprises:
   calculating a quantity of the ions to add to the electrochromic device based on the measured material property; and
   depositing the quantity of the ions on the electrochromic device.

6. A method of manufacturing a solid state electrochromic device having a target amount of ions, comprising:
   fabricating an electrochromic device with an initial concentration of ions less than a target amount:
   the electrochromic device including: an electrochromic layer;
   one or more top layers disposed on a top side of the electrochromic layer; and
   one or more bottom layers disposed on a bottom side of the electrochromic layer,
   wherein the electrochromic device has at least a bleach state and a color state, the bleach state being more transparent than the color state;
   after fabricating the electrochromic device, conducting at least one test on the electrochromic device wherein the at least one test includes measuring at least one material property of the electrochromic device during the test;
   after conducting the at least one test, depositing a quantity of the ions onto a surface of the electrochromic device based on the measured material property;
   electrically driving the quantity of the ions into device at least one of the one or more top layers and the one or more bottom layers of the electrochromic device; and
   repeatedly performing the testing, measuring, depositing, and driving operations until a material property measurement indicative of the target amount of the ions is achieved.

7. The method of claim 6, wherein the at least one material property includes at least one of initial ion loading and blind charge loss.

8. The method of claim 6, wherein the ions comprise lithium.

9. The method of claim 6, wherein the ions comprise hydrogen.

10. A method to insert ions into device layers of a solid state electrochromic device, comprising:
    conducting at least one test on an electrochromic device wherein the electrochromic device includes:
    an electrochromic layer;
    one or more top layers disposed on a top side of the electrochromic layer;
    and one or more bottom layers disposed on a bottom side of the electrochromic layer;
    wherein the electrochromic device has at least a bleach state and a color state, the bleach state being more transparent than the color state;

wherein the at least one test includes measuring at least one material property of the electrochromic device during the test;

after conducting the at least one test, depositing a quantity of the ions onto a surface of the electrochromic device based on the measured material property; and electrically driving the quantity of the ions into at least one of the one or more top layers and the one or more bottom layers of the electrochromic device.

11. The method of claim 10, wherein the at least one material property includes at least one of initial ion loading and blind charge loss.

12. The method of claim 10, wherein the ions comprise lithium.

13. The method of claim 10, wherein the ions comprise hydrogen.

14. The method of claim 10, wherein the step of depositing a quantity of the ions comprises:

calculating a quantity of the ions to add to the electrochromic device based on the measured material property; and depositing the quantity of the ions on the electrochromic device.

15. The method of claim 1, wherein the surface is a transparent electrode.

16. The method of claim 6, wherein the surface is a substrate.

* * * * *